(12) United States Patent
Yeh et al.

(10) Patent No.: US 12,471,387 B2
(45) Date of Patent: Nov. 11, 2025

(54) HIGH ESD IMMUNITY FIELD-EFFECT DEVICE AND MANUFACTURING METHOD THEREOF

(71) Applicant: Taiwan Semiconductor Manufacturing Company, Ltd., Hsinchu (TW)

(72) Inventors: Yu-Hung Yeh, Hsinchu (TW); Wun-Jie Lin, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/513,254

(22) Filed: Nov. 17, 2023

(65) Prior Publication Data

US 2024/0088135 A1    Mar. 14, 2024

Related U.S. Application Data

(63) Continuation of application No. 17/191,496, filed on Mar. 3, 2021, now Pat. No. 11,862,626.

(51) Int. Cl.
*H10D 89/60* (2025.01)
*H02H 9/04* (2006.01)

(52) U.S. Cl.
CPC .......... *H10D 89/811* (2025.01); *H02H 9/046* (2013.01); *H10D 89/911* (2025.01)

(58) Field of Classification Search
CPC .................................................. H01L 27/0288
See application file for complete search history.

(56) References Cited

U.S. PATENT DOCUMENTS 11,862,626 B2 * 1/2024 Yeh ........................ H02H 9/046
2008/0036002 A1    2/2008 Kishiro

* cited by examiner

*Primary Examiner* — Amar Movva
(74) *Attorney, Agent, or Firm* — STUDEBAKER BRACKETT PLLC

(57) ABSTRACT

An apparatus for providing electrostatic discharge (ESD) immunity and a method for fabricating the same are disclosed herein. The apparatus comprises a field effect transistor (FET) formed on a semiconductor substrate in a front-end-of-line (FEOL) layer during an FEOL process, a metal interconnect layer formed on top of the FEOL layer during a back-end-of-line (BEOL) process, wherein the metal interconnect layer comprises a plurality interconnects configured to interconnect the FET to a plurality of components formed on the semiconductor substrate, a power delivery network (PDN) formed under the semiconductor substrate in a backside layer during a backside back-end-of-line (B-BEOL) process, and a through substrate resistive component formed between the FEOL and B-BEOL layers, wherein a first contact of the through substrate resistive component is connected to a drain terminal of the FET and second contact is connected, through the PDN, to a power supply rail.

20 Claims, 4 Drawing Sheets

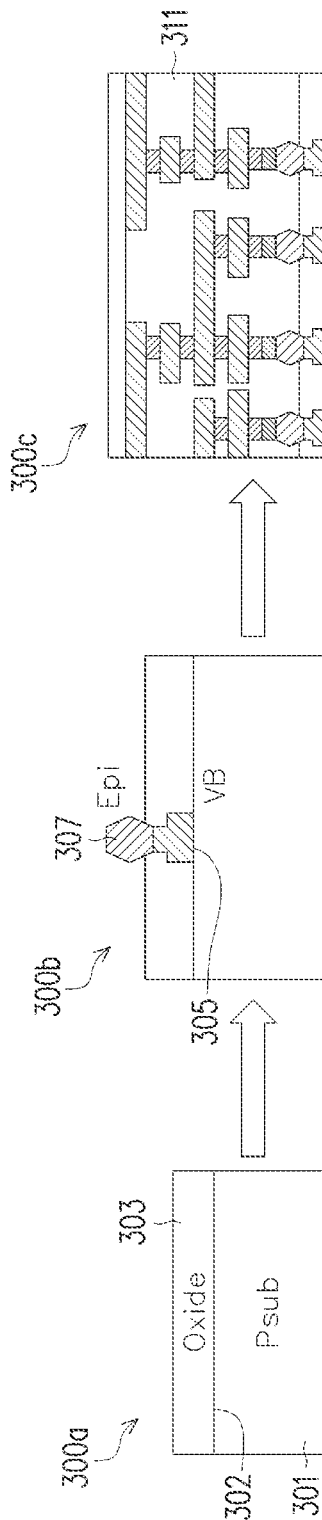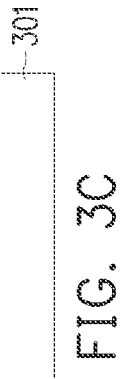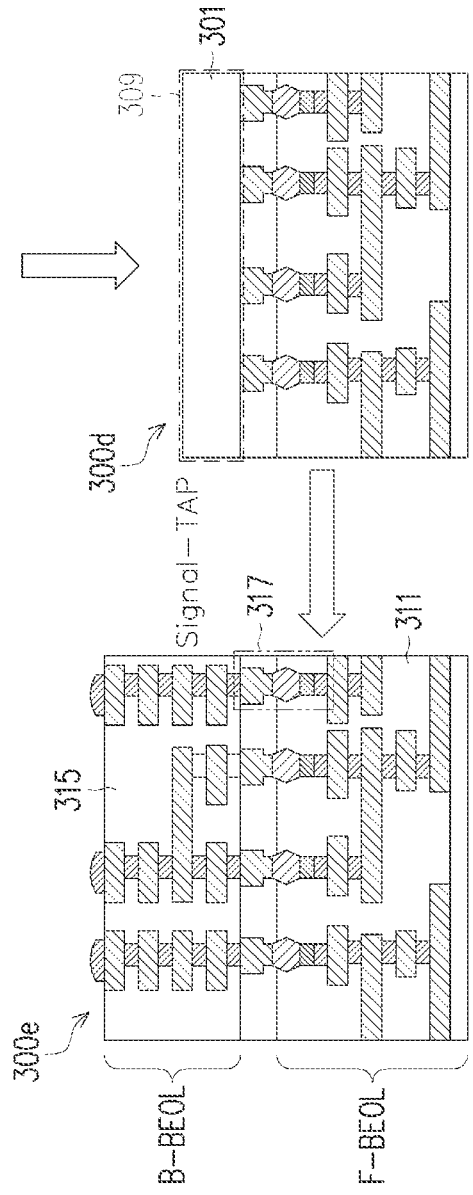

US 12,471,387 B2

HIGH ESD IMMUNITY FIELD-EFFECT DEVICE AND MANUFACTURING METHOD THEREOF

CROSS-REFERENCE TO RELATED APPLICATION

This application is a continuation of U.S. patent application Ser. No. 17/191,496, filed Mar. 3, 2021, the contents of which are incorporated by reference herein in its entirety.

BACKGROUND

With the advance of integrated circuit (IC) fabrication technologies, more and more circuits are integrated in a single chip. Moreover, a single IC chip can include an ESD protection circuit that is configured to protect the integrated circuits from electrostatic discharge (ESD) events. The ESD is a known cause of failure in metal oxide semiconductor field effect transistors (MOSFETs). For example, during an ESD event, a relatively large pulse of current may flow unintendedly through elements of an IC chip. The elements that initially encounter an ESD pulse are typically input and/or output buffers that are directly connected to bond pads or terminals, which may typically be exposed to an ESD pulse. Such input and/or output buffers, which are typically implemented using relatively large transistors, may be damaged by an ESD pulse. In some instances smaller internal transistors on a chip may be damaged as well.

In some instances, an ESD current pulse supplied to the transistor through the gate terminal will break down a dielectric gate oxide barrier between the gate and the channel, which may lead to permanent damage by leaving a conductive path of ionized dielectric or trapped electrons, or by burning a hole in the gate oxide. An ESD current pulse supplied to the drain may flow to either the substrate, the gate or the source of the transistor. Any of ESD current flows supplied to the drain may similarly cause permanent damage to the gate oxide. Even if the ESD pulse, which may be several thousand volts, does not flow directly from the drain to the gate, an electronic ripple from this pulse may destroy the gate oxide layer, which may break down at 20 volts or less. The destruction of the gate oxide renders the circuit, chip, and often the device containing the chip dysfunctional.

Several methods for improving the ESD immunity of advanced MOSFET and complementary metal-oxide-silicon (CMOS) devices have been proposed. One approach is to add a large space between the drain metal contact and the gate edge as a means to add resistance in series with the drain of the output transistor in order to avoid the high energy ESD pulses directly stressing the drain of the transistor. However, this approach suffers from low epitaxy quality that leads to ESD performance degradation during deep-submicron fabrication processes.

Thus, there is a need to provide an improved semiconductor structure for providing a better ESD immunity for advanced MOSFET and CMOS devices that better utilizes vertical integration and provides an additional resistance connected in series with the drain terminal.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

FIGS. 3A-3E illustrate cross-sectional views of a portion of a semiconductor device during a back side back end-of-line ("BEOL") fabrication process, in accordance with some embodiments.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
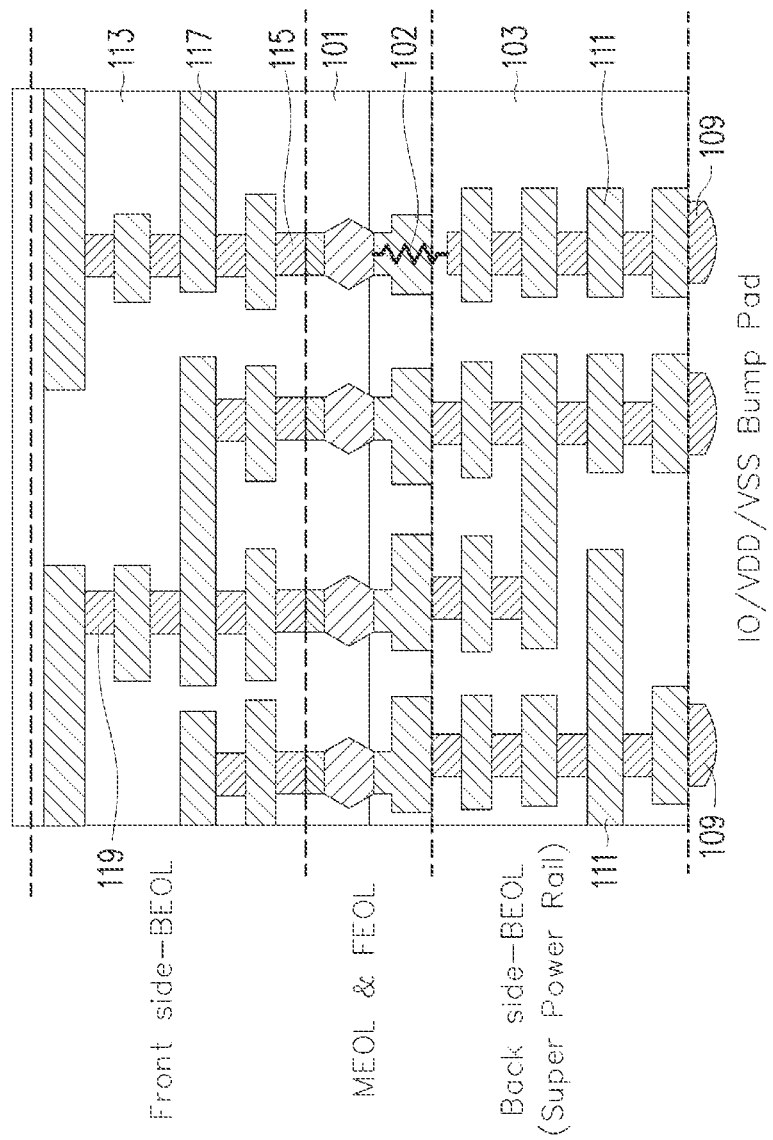
FIG. 1 illustrates a cross-sectional view of an exemplary wafer stack for implementing a through substrate resistive component, in accordance with some embodiments.

FIG. 1 illustrates a cross-sectional view of an exemplary wafer stack 100 for implementing a through substrate resistive component 102, in accordance with some embodiments. As shown in FIG. 1, the wafer stack 100 may use a back end-of-line ("BEOL") fabrication process to fabricate a first conductive interconnect layer 113. As such, the first conductive interconnect layer 113 may be used to interconnect components of integrated circuits (ICs) and other microdevices formed in a front-end-of-line ("FEOL") portion of a FEOL and mid-end-of-line ("MEOL") layer 101. In other embodiments, the first conductive interconnect layer 113 may include contacts (pads) 115, interconnect wires 117, and vertical conductive paths (vias) 119 suitable for interconnecting the integrated circuits (ICs) and other micro devices formed in the FEOL portion of the FEOL and MEOL layer 101. According to one embodiment, the first conductive interconnect layer 113 may also include contacts, insulating layers, multiple metal levels, and bonding sites configured to interconnect integrated circuits and micro devices fabricated in the FEOL portion of the FEOL and MEOL layer 101.

In further embodiments, the BEOL fabrication process may use a conductive material, such as aluminum (Al), copper (Cu) or a Cu-based alloy, to create metallization lines and vias in the first conductive interconnect layer 113. Moreover, in deep-submicron BEOL processes, the first conductive interconnect layer 113 may be insulated using the high-density plasma (HDP) oxide that exhibits a good gap filling capability, low dielectric constant, and a low defect density.

In further embodiments, the wafer stack 100 may use a MEOL fabrication process to fabricate the FEOL and MEOL layer 101. In some embodiments, the FEOL and MEOL layer 101 may include gate contacts as well as contact structures fabricated in the source and drain regions of a MEOL portion of a FEOL and MEOL portion of layer 101. In some embodiments, the FEOL and MEOL layer 101 is formed under the first conductive interconnect layer 113.

In further embodiments, the FEOL portion of the layer 101 may comprises a semiconductor substrate and the interconnect rails that are partially buried in the semiconductor substrate. In some embodiments, a substrate tap structure having a through substrate resistive component 102 may also be formed in the FEOL portion of the layer 101. In accordance with some embodiments, the through substrate resistive component 102 may be connected in series with a drain terminal of a transistor formed in the FEOL and MEOL layer 101. As such, the resistive component 102 provides an ESD immunity by enabling the drain of the transistor to tolerate higher ESD voltages and large hot carrier injections. One exemplary advantage of the above mentioned implementation of the substrate tap structure having the through substrate resistive component 102 is lower process impact and improved epitaxy control compared to prior approaches of extending the drain terminal to implement an additional resistance in the FEOL and MEOL layer 101.

In various embodiments, the wafer stack 100 may include a backside layer 103 formed under the front-end-of-line ("FEOL") and mid-end-of-line ("MEOL") layer 101. In some embodiments, the backside layer 103 may be formed using a backside back end-of-line ("B-BEOL") process. In some embodiments, the B-BEOL process may be substantially similar to the BEOL process. In further embodiments, the backside layer 103 may include a power delivery network ("PDN") 111 configured to deliver power to the individual integrated circuits and micro devices. In some embodiments, the PDN 111 is formed under the FEOL and MEOL layer 101. Moreover, the power delivery network in the PDN 111 may be connected to the buried interconnect rails of the FEOL and MEOL layer 101 by way of metal-filled TSVs (Through-Semiconductor Vias) or by way of damascene-type contacts. Moreover, the FEOL and MEOL layer 101 may also include layer interconnect vias configured to route signals from the PDN 111 to the first conductive interconnect layer. In some embodiments, the layer interconnect vias may be shielded from the integrated circuits and their interconnections formed in the FEOL and MEOL layer 101.

In some embodiments, the backside layer 103 may include one or more metal interconnect levels. As such, the one or more metal interconnect levels of backside layer 103 may be composed of copper (Cu), aluminum (Al) or an alloy thereof such as, for example, a Cu—Al alloy. The one or more metal interconnect levels can be formed utilizing a deposition process such as, for example, CVD, PECVD, sputtering, chemical solution deposition or plating.

As illustrated in FIG. 1, a passive component 105 may be formed in the backside layer 103. In some embodiments, the backside layer 103 may be used to pattern the passive component 105 of a voltage-controlled oscillator (VCO), analog-to-digital converter (ADC), or filter. In some embodiments, the passive component 105 may be an inductor, capacitor, resistor, or a network comprising interconnected inductors, capacitors, and resistors. For example, the passive component 105 may be a planar resistor. As another example, the passive component 105 may be a vertical resistance with a tunable resistance value located between the metal interconnect levels. In yet another example, the passive component 105 may be a vertical parallel plate Metal-Oxide-Metal (MOM) capacitor formed on the one or more metal interconnect levels. In some embodiments, the MOM capacitor may be formed using multiple interdigitated fingers formed on the one or more metal interconnect levels.

In further embodiments, the wafer stack 100 may also include multiple solder bump terminals 109, called bump pads, which are used as the input/output (I/O) terminals as well as power supply (VDD and VSS) contacts. In one embodiment, the solder bump pads 109 may be formed over the bottom surface of the backside layer 103. In some embodiments, the solder bump pads 109 may be linearly aligned bump pad arrays, where each linearly aligned bump pad array may have one or more I/O bump pads, one or more VDD bump pads, and one or more VSS bump pads.

The relatively large resistive component 102 connected between the drain and PDN 111 provides improved protection against ESD events supplied at the input/output (I/O) terminals or the power supply (VDD and VSS) contacts 109. As such, the resistive voltage drop across the resistive component 102 shields the drain terminal of the transistor from being directly stressed by the ESD pulse. More specifically, the resistive component 102 provides enough length to keep the voltage drop across it below a maximum nondestructive drain voltage.

Figure 2:
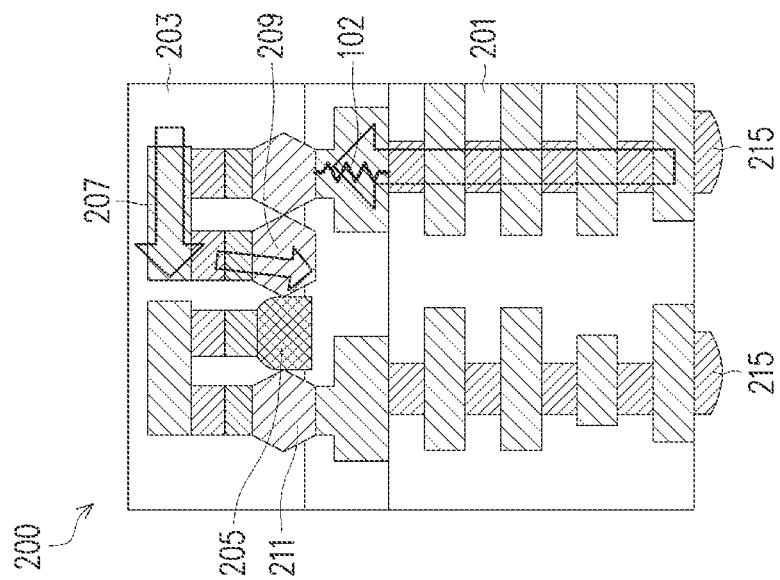
FIG. 2 illustrates a cross-sectional view of an exemplary FET device with a drain terminal connected in series with the through substrate resistive component, in accordance with some embodiments.

FIG. 2 illustrates a cross-sectional view of an exemplary FET device 200 with a drain terminal 209 connected in series with the through substrate resistive component 102, in accordance with some embodiments. In some embodiments, the FET device 200 includes a gate terminal 205, a source terminal 211, and a drain terminal 209. In some embodiments, a first contact terminal of the through substrate resistive component 102 may be connected to the PDN implemented in a backside layer 201 and a second contact terminal of the through substrate resistive component 102 may be connected to the drain terminal 209 through an interconnect 207. Furthermore, the resistive component may be connected to the power supply VDD/VSS contacts 215, through the PDN. In some embodiments, the interconnect 207 may be formed in a MEOL portion of a FEOL and MEOL layer 203. The FEOL and MEOL layer 203 is fabricated in a substantially similar fashion as the FEOL and MEOL layer 103 described in FIG. 1 above. In some embodiments, the backside layer 201 may be formed below the FEOL and MEOL layer 203. In further embodiments, the backside layer 201 may have multiple layers and may be formed by any method known in the art, including, but not limited to, chemical vapor deposition, sputter deposition, plating, and the like. In further embodiments, passive components of various other integrated circuits such as VSOs, ADCs, or filters may also be formed in the backside layer 201 using one or more layers of aluminum (Al), copper (Cu), or titanium, a layer of silicon dioxide (SiO.sub.2), and a layer of high-resistance polysilicon.

In some embodiments, substrate resistive component 102 may be implemented using a through-silicon via (TSV) fabrication process. In some embodiments, a length and width of the resistive component 102 may be selected to achieve a desired resistance value. In further embodiments, the resistive component 102 may have a tapered profile for achieving the desired resistance value.

FIGS. 3A-3E illustrate cross-sectional views of a portion of a semiconductor device during a back side back end-of-line ("B-BEOL") fabrication process, in accordance with some embodiments. In some embodiments, at a first stage of the B-BEOL fabrication process, a semiconductor structure may include a silicon (Si) substrate layer 301 with a structured masking layer 303 as shown in a cross-sectional view 300a of FIG. 3A. In accordance with some embodiments, the masking layer 303 may be, for example, an oxide or a nitride layer. This mask layer 303 may be deposited on the top side surface 302 of the silicon substrate 301. According to some embodiments, at a second stage of the B-BEOL fabrication process, the semiconductor structure may include an etch mask, i.e., photoresist mask that is formed to expose the portion of the masking layer 303 that are to be etched to expose the underlying surface of the base semiconductor substrate 301 for a seed surface 305 for an epitaxial growth 307 as shown in a cross-sectional view 300b of FIG. 3B. In some embodiments, the etch process may be an anisotropic etch process, such as reactive ion etch (RIE). Other anisotropic etch processes that are suitable at this stage of the present disclosure include ion beam etching, plasma etching or laser ablation. In some embodiments, at least one resistive component is formed in the epitaxial growth structure 307. At a third stage of the B-BEOL fabrication process, a back end-of-line ("BEOL") layer 311 may be formed on top of the epitaxial growth structure 307. In other embodiments, the BEOL layer 311 includes contacts (pads), interconnect wires, and vertical conductive paths (vias) suitable for interconnecting the integrated circuits (ICs) and other microdevices as shown in a cross-sectional view 300c of FIG. 3C.

In further embodiments, at a fourth stage of the B-BEOL process, polishing processes, such as a chemical mechanical polishing (CMP) process may be used to polish a bottom surface 309 of the silicon substrate 301 as shown in a cross-sectional view 300d of FIG. 3D. At the fourth stage, the bottom surface 309 of the silicon substrate 301 is finished to clear the substrate surface 309 of any active ingredients from the polishing process.

At the fifth stage of the B-BEOL process, the backside layer 315 may be formed on the semiconductor structure as shown in a cross-sectional view 300e of FIG. 3E. In some embodiments, a process of forming backside layer 315 may be substantially similar to the BEOL process. In further embodiments, the backside layer 315 may include a power delivery network ("PDN") configured to deliver power to the individual integrated circuits and micro devices. In some embodiments, the backside layer 315 may also include one or more metal interconnect levels. As shown in FIG. 3, a resistive component 317 may be formed between the BEOL layer 311 and the backside layer 315. In some embodiments, the resistive component 317 may be connected to the drain terminal of a transistor and the power supply VDD/VSS contacts, through the PDN.

Figure 4:
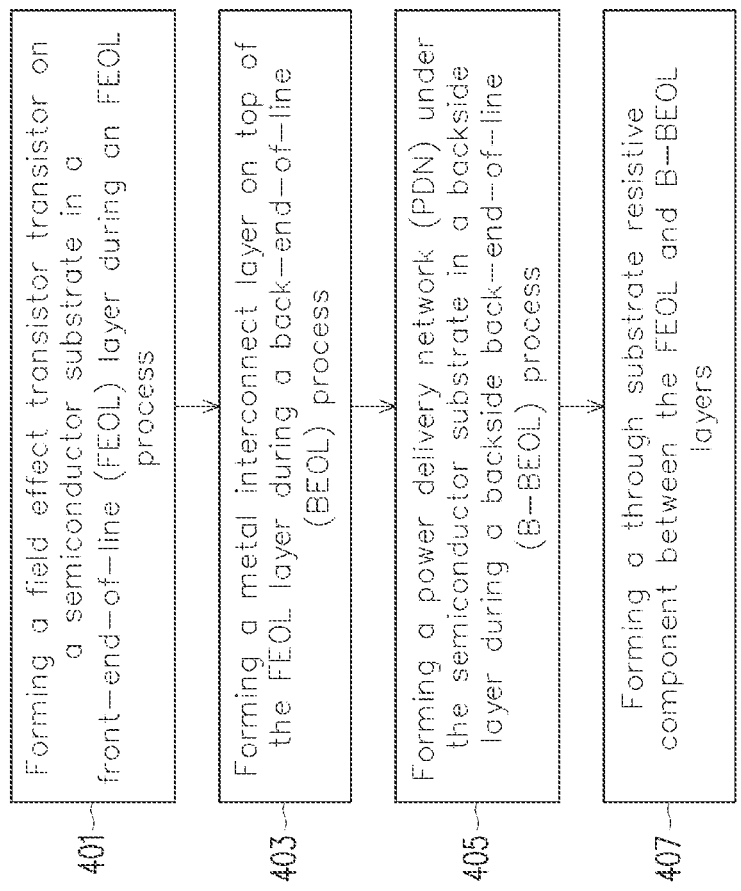
FIG. 4 illustrates a flow diagram of a method of forming an electrostatic discharge (ESD) protection device, in accordance with some embodiments.

FIG. 4 illustrates a flow diagram of a method of forming an electrostatic discharge (ESD) protection device, in accordance with some embodiments. Although the exemplary method shown in FIG. 4 is described in relation to FIGS. 1-3, it will be appreciated that this exemplary method is not limited to such structures disclosed in FIGS. 1-3 and may stand alone independent of the structures disclosed in FIGS. 1-3. In addition, some operations of the exemplary method illustrated in FIG. 4 may occur in different orders and/or concurrently with other operations or events apart from those illustrated and/or described herein. Moreover, not all illustrated operations may be required to implement one or more aspects or embodiments of the present disclosure. Further, one or more of the operations depicted herein may be carried out in one or more separate operations and/or phases.

At operation 401, a field effect transistor (FET) may be formed during a front-end-of-line (FEOL) process. In some embodiments, during the FEOL process, the layer 203 (FIG. 2) may be formed which may comprise a semiconductor substrate and formed FET. In further embodiments, a plurality of transistors may be formed on the semiconductor substrate. Moreover, the plurality of transistors may be connected in series between a high power supply rail and a low power supply rail. In some embodiments, the formed transistor devices may be part of an ESD power claim circuit, VSO, ADC, input/output buffer, or filter.

At operation 403, a metal interconnect layer (e.g., 113 of FIG. 1) may be formed during a back-end-of-line (BEOL) process. In some embodiments, the metal interconnect layer may be used to interconnect the FET and other microdevices formed during the FEOL process. In other embodiments, the metal interconnect layer may include contacts (pads), interconnect wires, and vertical conductive paths (vias) suitable for interconnecting the plurality of transistors. According to one embodiment, the metal interconnect layer may also include contacts, insulating layers, multiple metal levels, and bonding sites configured to interconnect the plurality of transistors. In further embodiments, during the operation 403, a conductive material, such as aluminum (Al), copper (Cu) or a Cu-based alloy, may be used to create metallization lines and vias.

At operation 405, a backside layer, such as backside layer 201 (FIG. 2) may be formed under the FET formed during the FEOL process at operation 401. More specifically, the backside layer may be formed at a bottom surface of a semiconductor surfaced used for patterning the FET. In some embodiments, the backside layer may be formed by a backside back-end-of-line (B-BEOL) process that is substantially similar to the BEOL process. In some embodiments, the backside layer may include a power delivery network (PDN) layer that is configured to deliver power to the plurality of transistor devices formed during the operation 401. In some embodiments, the one or more metal interconnect levels comprising copper (Cu), aluminum (Al) or an alloy thereof such as, for example, a Cu—Al alloy may be formed in the backside layer. In addition, the one or more metal interconnect levels can be formed utilizing a deposition process such as, for example, CVD, PECVD, sputtering, chemical solution deposition or plating.

At operation 407, a through substrate resistive component 102 (FIG. 2) is formed between the FEOL and B-BEOL layers. In some embodiments, a first contact of the through substrate resistive component may be connected to a drain terminal of the FET and a second contact of the through substrate resistive component is connected, through the PDN 111 (FIG. 1), to a power supply rail. In further embodiments, at operation 407, a resistance of the through substrate resistive component is configured to provide an ESD immunity for the FET to enable the drain of the FET to tolerate high ESD voltages. In accordance with some embodiments, a length and a width of the through substrate resistive component may be determined based on a predetermined resistance value that is desired to provide an ESD immunity during an ESD event.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:
1. An apparatus comprising:
a field effect transistor (FET) formed on a semiconductor substrate in a front-end-of-line (FEOL) layer during a FEOL process;
a metal interconnect layer formed on top of the FEOL layer, wherein the metal interconnect layer comprises an interconnect configured to interconnect the FET to at least one component formed on the semiconductor substrate;

a power delivery network (PDN) formed under the semiconductor substrate in a backside layer; and a through substrate resistive component formed between the FEOL layer and a backside back-end-of-line (B-BEOL) layer, wherein a first contact of the through substrate resistive component is connected to a drain terminal of the FET and a second contact of the through substrate resistive component is connected to the PDN.

2. The apparatus of claim 1, wherein the backside layer comprises one or more metal interconnect levels that are separated by one or more dielectric layers.

3. The apparatus of claim 1, wherein the resistive component has a vertically tapered profile for achieving a predetermined resistance value.

4. The apparatus of claim 1, wherein the first contact of the through substrate resistive component is connected to a drain terminal of the FET through an interconnect formed in the FEOL layer.

5. The apparatus of claim 1, wherein the PDN is coupled to a power supply rail, and wherein the power supply rail is coupled to a solder bump pad formed over a bottom surface of the B-BEOL layer.

6. An electrostatic discharge (ESD) protection device comprising:
   at least one transistor formed on a semiconductor substrate during a front-end-of-line (FEOL) process;
   a metal interconnect formed on top of the at least one transistor during a back-end-of-line (BEOL) process and configured to interconnect the at least one transistor to at least one other component; and
   through substrate resistive components connected to a terminal of the at least one transistor through the metal interconnect, wherein the through substrate resistive components are configured to clamp an ESD voltage during an ESD event.

7. The electrostatic discharge (ESD) protection device of claim 6, wherein the at least one transistor comprises a plurality of transistors, and wherein the plurality of transistors are connected in series between a high power supply rail and a low power supply rail.

8. The electrostatic discharge (ESD) protection device of claim 6, wherein the metal interconnect comprises one or more metal interconnect levels that are separated by one or more dielectric layers.

9. The electrostatic discharge (ESD) protection device of claim 6, wherein the through substrate resistive component is electrically connected to a power supply rail through a power delivery network (PDN).

10. The electrostatic discharge (ESD) protection device of claim 9, wherein the through substrate resistive component is formed between an FEOL layer and a backside back-end-of-line (B-BEOL) layer that are formed during the FEOL process and a B-BEOL process, respectively.

11. The electrostatic discharge (ESD) protection device of claim 10, wherein the power supply rail is coupled to a solder bump pad formed over a bottom surface of the B-BEOL layer.

12. The electrostatic discharge (ESD) protection device of claim 10, wherein the PDN is formed under the semiconductor substrate during the B-BEOL process.

13. The electrostatic discharge (ESD) protection device of claim 6, wherein the resistive component has a vertically tapered profile for achieving a predetermined resistance value.

14. The electrostatic discharge (ESD) protection device of claim 6, wherein a length and width of the through substrate resistive component is based on a predetermined resistance value.

15. An electrostatic discharge (ESD) protection device on a semiconductor substrate comprising:
   a transistor on the semiconductor substrate in a front-end-of-line (FEOL) layer;
   an interconnect layer above the FEOL layer, the interconnect layer configured to connect the transistor to a component on the semiconductor substrate; and
   a through substrate resistive component below the FEOL layer and connected to a terminal of the transistor through the interconnect, wherein the through substrate resistive component is configured to clamp an ESD voltage during an ESD event.

16. The electrostatic discharge (ESD) protection device of claim 15, wherein the transistor is connected in series between a high power supply rail and a low power supply rail.

17. The electrostatic discharge (ESD) protection device of claim 15, wherein the through substrate resistive component is electrically connected to a power supply rail through a power delivery network (PDN).

18. The electrostatic discharge (ESD) protection device of claim 15, wherein the through substrate resistive component is above a backside back-end-of-line (B-BEOL) layer.

19. The electrostatic discharge (ESD) protection device of claim 15, further comprising a power delivery network (PDN) under the semiconductor substrate in a backside layer and wherein the through substrate resistive component is connected to the PDN.

20. The electrostatic discharge (ESD) protection device of claim 15, wherein the interconnect comprises one or more metal interconnect layers separated by one or more dielectric layers.

* * * * *